US009818875B1

United States Patent
Bi et al.

(10) Patent No.: US 9,818,875 B1
(45) Date of Patent: Nov. 14, 2017

(54) APPROACH TO MINIMIZATION OF STRAIN LOSS IN STRAINED FIN FIELD EFFECT TRANSISTORS

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/295,546

(22) Filed: Oct. 17, 2016

(51) Int. Cl.
| | | |
|---|---|---|
| *H01L 29/76* | (2006.01) | |
| *H01L 29/78* | (2006.01) | |
| *H01L 29/66* | (2006.01) | |
| *H01L 29/417* | (2006.01) | |
| *H01L 29/06* | (2006.01) | |
| *H01L 21/3065* | (2006.01) | |
| *H01L 29/10* | (2006.01) | |

(52) U.S. Cl.
CPC ........ *H01L 29/785* (2013.01); *H01L 21/3065* (2013.01); *H01L 29/0649* (2013.01); *H01L 29/1054* (2013.01); *H01L 29/41791* (2013.01); *H01L 29/66553* (2013.01); *H01L 29/66795* (2013.01); *H01L 29/7849* (2013.01)

(58) Field of Classification Search
CPC ............... H01L 29/785; H01L 21/3065; H01L 29/0649; H01L 29/1054; H01L 29/41791; H01L 29/66553; H01L 29/66795; H01L 29/7849

USPC ......................................................... 257/401
See application file for complete search history.

(56) References Cited

U.S. PATENT DOCUMENTS

| | | | | |
|---|---|---|---|---|
| 6,727,550 | B2 * | 4/2004 | Tezuka | H01L 29/1054 257/18 |
| 6,943,407 | B2 * | 9/2005 | Ouyang | H01L 21/823807 257/329 |
| 7,358,571 | B2 * | 4/2008 | Ko | H01L 29/78618 257/347 |
| 7,615,471 | B2 * | 11/2009 | Mantl | H01L 21/0245 117/7 |
| 7,675,115 | B2 * | 3/2010 | Tezuka | H01L 21/823807 257/351 |
| 7,705,345 | B2 | 4/2010 | Bedell et al. | |
| 8,211,772 | B2 * | 7/2012 | Kavalieros | H01L 29/66795 257/E21.409 |
| 8,247,275 | B2 | 8/2012 | Hoentschel et al. | |

(Continued)

FOREIGN PATENT DOCUMENTS

| | | |
|---|---|---|
| CN | 205177853 U | 4/2016 |
| JP | 2014 165495 A | 9/2014 |

*Primary Examiner* — Ori Nadav
(74) *Attorney, Agent, or Firm* — Tutunjian & Bitetto, P.C.; Vazken Alexanian

(57) ABSTRACT

A method of fabricating a vertical fin field effect transistor with a strained channel, including, forming a strained vertical fin on a substrate, forming a plurality of gate structures on the strained vertical fin, forming an interlevel dielectric on the strained vertical fin, forming a source/drain contact on the vertical fin adjacent to each of the plurality of gate structures, and selectively removing one or more of the source/drain contacts to form a trench adjacent to a gate structure.

14 Claims, 12 Drawing Sheets

(56) References Cited

U.S. PATENT DOCUMENTS

| | | | |
|---|---|---|---|
| 8,368,050 B2 | 2/2013 | Fattal et al. | |
| 8,617,996 B1 * | 12/2013 | Chi | H01L 21/30604 |
| | | | 257/E21.377 |
| 8,916,933 B2 | 12/2014 | Cheng et al. | |
| 9,196,710 B2 | 11/2015 | Wei et al. | |
| 9,224,822 B2 | 12/2015 | Cheng et al. | |
| 9,236,474 B2 * | 1/2016 | Morin | H01L 29/7842 |
| 9,240,481 B2 | 1/2016 | Maeda et al. | |
| 9,245,980 B2 | 1/2016 | Akarvardar et al. | |
| 9,257,556 B2 | 2/2016 | Xu et al. | |
| 9,343,550 B2 * | 5/2016 | Cheng | H01L 27/1211 |
| 9,373,624 B1 | 6/2016 | Balakrishnan et al. | |
| 9,466,723 B1 * | 10/2016 | Huang | H01L 29/7851 |
| 9,520,297 B2 * | 12/2016 | Lee | H01L 29/66795 |
| 2011/0068401 A1 * | 3/2011 | Izumida | H01L 21/823431 |
| | | | 257/347 |
| 2012/0208329 A1 * | 8/2012 | Bryant | H01L 21/84 |
| | | | 438/151 |
| 2014/0145242 A1 * | 5/2014 | Huang | H01L 21/823807 |
| | | | 257/192 |
| 2015/0069465 A1 | 3/2015 | Cheng et al. | |
| 2015/0076514 A1 * | 3/2015 | Morin | H01L 29/7843 |
| | | | 257/77 |
| 2015/0097270 A1 * | 4/2015 | Bedell | H01L 27/0924 |
| | | | 257/618 |
| 2015/0144962 A1 | 5/2015 | Rim et al. | |
| 2015/0311082 A1 * | 10/2015 | Bouche | H01L 29/41775 |
| | | | 257/288 |
| 2016/0141417 A1 * | 5/2016 | Park | H01L 29/66545 |
| | | | 257/365 |
| 2016/0190272 A1 * | 6/2016 | Su | H01L 21/823481 |
| | | | 438/283 |
| 2017/0012033 A1 * | 1/2017 | Hung | H01L 27/0207 |

\* cited by examiner

APPROACH TO MINIMIZATION OF STRAIN LOSS IN STRAINED FIN FIELD EFFECT TRANSISTORS

BACKGROUND

Technical Field

The present invention generally relates to a fabrication approach to minimizing the loss of induced strain from the fin of a field effect transistor (FinFET), and more particularly to performing a fin cut after formation of gate structures, source/drains, and interlevel dielectric layers.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS), where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of fabricating a vertical fin field effect transistor with a strained channel is provided. The method includes forming a strained vertical fin on a substrate, forming a plurality of gate structures on the strained vertical fin, forming an interlevel dielectric on the strained vertical fin, forming a source/drain contact on the vertical fin adjacent to each of the plurality of gate structures, and selectively removing one or more of the source/drain contacts to form a trench adjacent to a gate structure.

In accordance with another embodiment of the present invention, a method of fabricating a vertical fin field effect transistor with a strained channel is provided. The method includes forming a strained silicon-germanium (SiGe) vertical fin on a single crystal silicon substrate or a strained silicon (Si) vertical fin on a single crystal silicon-germanium substrate, forming three or more gate structures on the strained SiGe or Si vertical fin, forming a gate spacer on each of the three or more gate structures, forming an interlevel dielectric on the gate spacers, forming four or more openings in the interlevel dielectric, forming four or more source/drain contacts in the interlevel dielectric on the vertical fin, where at least two of the source/drain contacts are between the gate spacers, and selectively removing one or more of the source/drain contacts to form a trench in the interlevel dielectric.

In accordance with another embodiment of the present invention, a vertical fin device is provided. The vertical fin device includes a plurality of strained, straight, vertical fin segments on a substrate, a gate spacer on each of the plurality of strained, straight, vertical fin segments, a gate structure within each of the gate spacers, a source/drain contact on one or more of the plurality of strained, straight, vertical fin segments adjacent to at least one of the plurality of gate spacers, and an interlevel dielectric on each gate spacer and the source/drain contacts.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
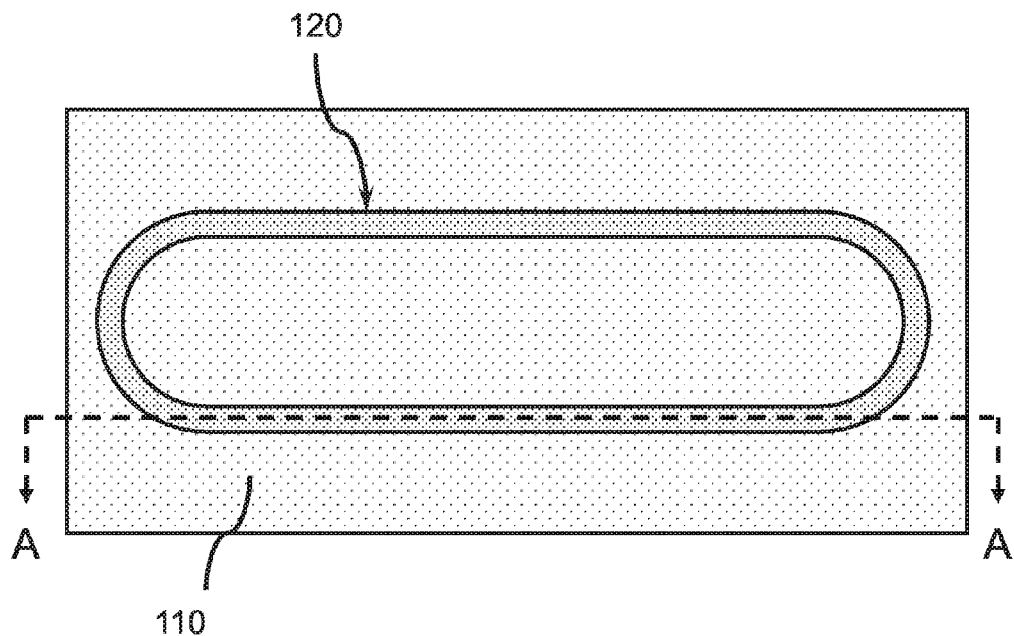
FIG. 1 is a top view showing a monolithic vertical fin on a substrate, in accordance with an embodiment of the present invention.

Principles and embodiments of the present invention relate generally to avoiding a significant loss of strain in a strained fin field effect transistor by fabricating gate structures and insulating layers on a fin before performing a fin cut to section a monolithic vertical fin into separate device segments. Typically portions of a fin are removed to form separate device segments early in the fabrication process, and particularly before formation of a gate structure. By delaying sectioning of a vertical fin until after gate structure fabrication, the gate structure anchors the fin in position, so as to maintain the fin in a strained state. Similarly, formation of insulating layers (e.g., interlevel dielectric (ILD)) that are in contact with at least a portion of the vertical fins throughout the fabrication process, including both before and after removing portions of the fin, can at least assist in maintaining the fin in a strained state.

It has been found that sectioning a fin prior to forming other device components that can act as anchoring structures provides a pathway for relaxation of strain induced in a vertical fin. A substantial amount of strain in a vertical fin, particularly at the fin ends, can be lost after a fin-cut fabrication step due to the elastic relaxation of the free standing fins. Strain relaxation can be minimized when the rest of the fins are anchored by the gate structure, spacers, source/drains, interlevel dielectric (ILD), and/or contact materials.

Principles and embodiments of the present invention relate to a sequence of fabrication steps that forms a FinFET with a strained channel. A silicon-germanium (SiGe) or silicon (Si) vertical fin can be formed by a sidewall image transfer (SIT) process with an induced stress (e.g., due to lattice mismatch), and sectioned into individual FinFET devices having one or more vertical fins without significant loss of strain by forming the FinFET device gate structures before performing a fin-cut.

Principles and embodiments of the present invention also relate to forming one or more FinFET devices on a single vertical fin before removing sections of the vertical fin to cut the monolithic fin into separate segments for individual devices. The fins are first formed without cutting. After forming other transistor elements such as a gate, spacers, source/drains, and metal contacts, a fin cut mask can then be applied to define the regions of material to be removed. The fins are then cut, where the fin cut can be performed at the very end of the transistor fabrication.

In various embodiments, a dummy gate replacement process would be performed before the fin cut.

Exemplary applications/uses to which the present invention can be applied include, but are not limited to: vertical FinFETs, complementary metal-oxide-semiconductor (CMOS) field effect transistors, digital logic gates (e.g., NAND, NOR, XOR, etc.) and memory devices (e.g., DRAM, SRAM, etc.).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer may be by one or more deposition processes, where, for example, a conformal layer can be formed by a first process (e.g., ALD, PEALD, etc.) and a fill can be formed by a second process (e.g., CVD, electrodeposition, PVD, etc.).

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

It is to be understood that aspects of the present invention will be described in terms of a given illustrative architecture;

however, other architectures, structures, substrate materials and process features and steps can be varied within the scope of aspects of the present invention.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a top view of a vertical fin on a substrate is shown, in accordance with an embodiment of the present invention.

In one or more embodiments, a vertical fin 120 can be formed on a substrate 110, where the vertical fin can be formed by a sidewall image transfer (SIT) process, as would be known in the art. In various embodiments, the vertical fins 120 may be etched into the substrate 110 or an epitaxial layer on the substrate by employing a lithographic patterning process, a SIT process, (e.g., self-aligned quadruple patterning (SAQP) or a self-aligned double patterning (SADP)), or epitaxially grown on the substrate. In one or more embodiments, fins are formed by a SIT process. FIG. 1 shows a monolithic fin loop (i.e., a single unit composed of the same material) after a SIT process without cutting the ends of the fin loop, where the fin loop may have an oval or rectangular shape.

Figure 2:
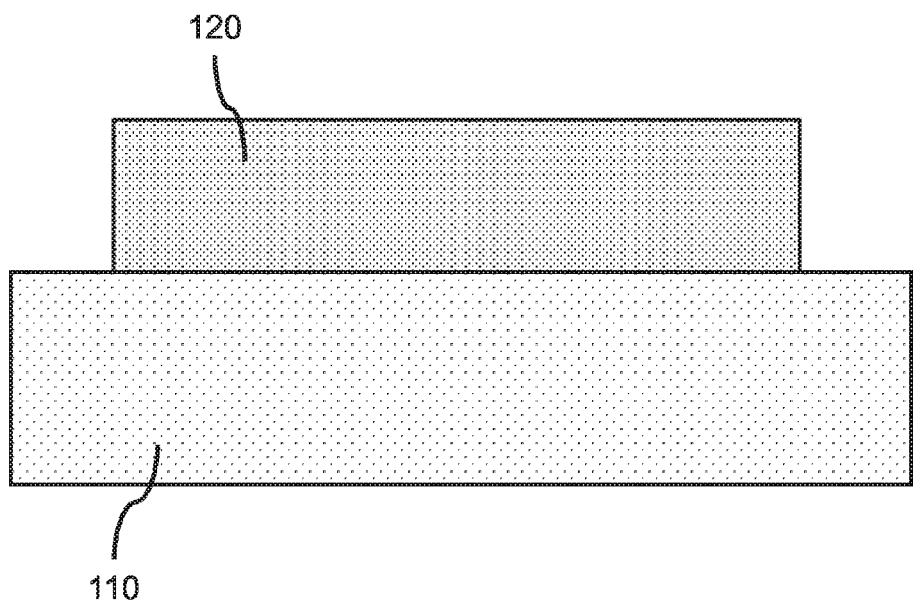
FIG. 2 is a cross-sectional view showing the AA cross-section of the vertical fin on a substrate in FIG. 1, in accordance with an embodiment of the present invention.

FIG. 2 is a cross-sectional view showing the AA cross-section of the vertical fin on a substrate in FIG. 1, in accordance with an embodiment of the present invention.

In one or more embodiments, a substrate 110 can be a semiconductor or an insulator, or a combination of semiconductor and insulator with an active surface layer (ASL) made of a semiconductor material. Various portions of the substrate 110 can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe.

In one or more embodiments, the substrate 110 can have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface semiconductor layer of the substrate 110 can be on a substrate insulator layer (e.g., buried oxide layer (BOX)). The substrate 110 can also have other layers forming the substrate, including high-k oxides and/or nitrides. The substrate 110 can also have other device structures such as isolation regions (not shown). In one or more embodiments, a substrate insulator layer (e.g., BOX layer) can be formed on at least a portion of a substrate 110.

In various embodiments, the substrate 110 may be a single crystal silicon (Si), silicon-germanium (SiGe), or III-V semiconductor (e.g., GaAs) wafer, or have a single crystal silicon (Si), silicon-germanium (SiGe), or III-V semiconductor (e.g., GaAs) active surface layer. In one or more embodiments, the substrate 110 can be a silicon wafer.

In one or more embodiments, the vertical fin 120 can be formed on the substrate, where the vertical fin can be a strained vertical fin made of a semiconductor material. The vertical fin 120 can have a tensile or compressive strain. In some embodiments, the strain in the vertical fin 120 ranges from 0.3% to 1.5%, although fins with greater or less strain can also be employed.

In a non-limiting exemplary embodiment, the substrate 110 can include single crystal silicon at the surface, and the vertical fin 120 can be silicon-germanium (SiGe) epitaxially grown on the surface of the single crystal silicon, such that the SiGe fin has an induced compressive strain.

In another non-limiting exemplary embodiment, the substrate 110 can include relaxed silicon-germanium (SiGe) at the surface, and the vertical fin 120 can be silicon (Si) epitaxially grown on the surface of the crystalline SiGe, such that the Si fin has an induced tensile strain.

In one or more embodiments, the height of the vertical fin 120 and the germanium (Ge) concentration of the SiGe vertical fin are below the threshold value at which dislocations would appear in the vertical fin 120.

The vertical fin 120 can have curved wall sections 121 and straight wall sections 122, where the straight wall sections 122 can be utilized as channels for FinFET transistors, and the curved wall sections can be covered by an ILD or removed by a fin-cut process. Other shapes for the monolithic vertical fin(s) 120 are also contemplated.

Figure 3:
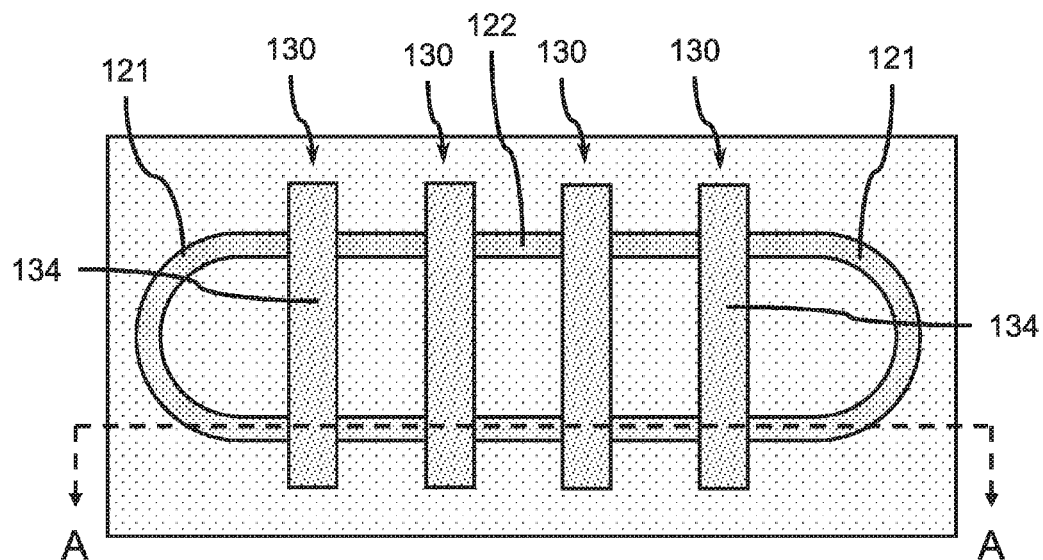
FIG. 3 is a top view showing a plurality of gate structures formed across the straight portions of the monolithic vertical fin, in accordance with an embodiment of the present invention.

FIG. 3 is a top view showing a plurality of gate structures formed across the straight portions of the monolithic vertical fin, in accordance with an embodiment of the present invention.

In one or more embodiments, a plurality of gate structures 130 can be formed on the monolithic vertical fin 120, where each gate structure 130 can span (e.g., be athwart) the two straight sections 122 of the vertical fin 120, where each of the gate structures 130 may cover a portion of both straight sections 122 of the vertical fin 120. The straight portions of the vertical fin 120 can be parallel. The gate structures 130 can be rectangular in shape. A suitable gap can remain between adjacent gate structures 130 to allow formation of gate spacers and source/drains on and/or within the interior cavity of the vertical fin 120. The vertical fin 120 can have straight wall sections 122 sufficiently long to form a plurality of gate structures 130, gate spacers, and source/drain contacts for fabrication of a semiconductor device (e.g., n-type or p-type FinFETs).

In various embodiments, at least three gate structures can be formed on the vertical fin 120, where there is a sufficient gap between each of the adjacent gate structures to provide for subsequent formation of source/drains, source/drain contacts, and other device components. In various embodiments, six or more gate structures 130 may be formed on a monolithic vertical fin 120, where three gate structures may be utilized from the six to form two FinFET devices from the same vertical fin. The two FinFET devices can be an NFET and a PFET to form a CMOS (i.e., complementary metal oxide semiconductor). While only four gate structures 130 are depicted in the figures, this is intended to illustrate the inventive concept and should not be considered a limitation.

Figure 4:
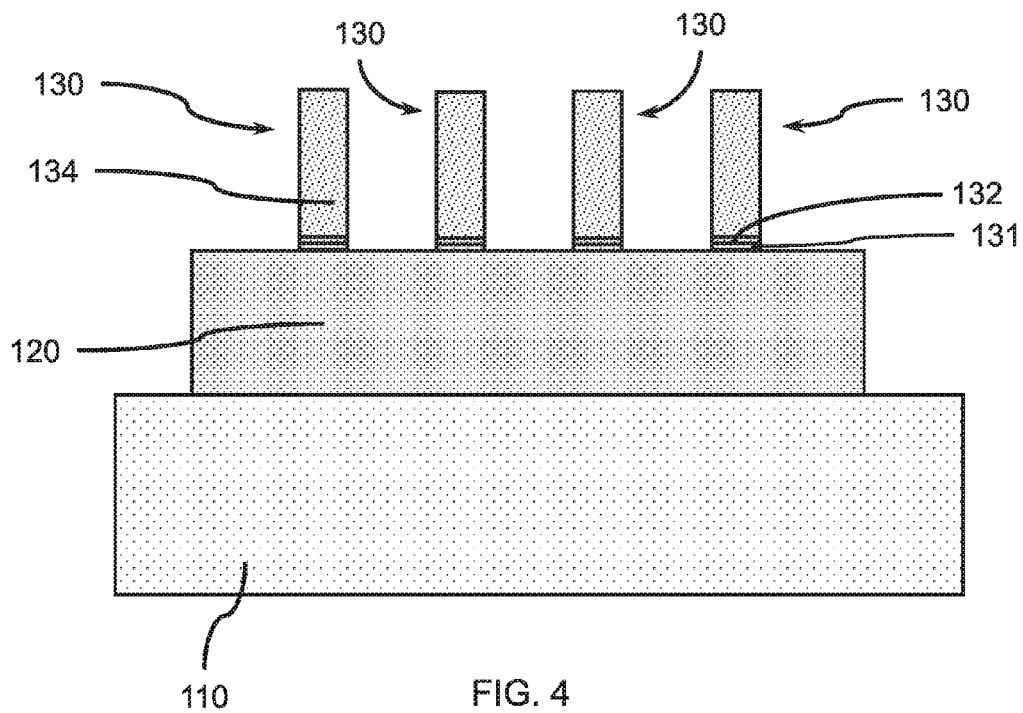
FIG. 4 is a cross-sectional view showing the AA cross-section of a plurality of gate structures formed on sections of the monolithic vertical fin in FIG. 3, in accordance with an embodiment of the present invention.

FIG. 4 is a cross-sectional view showing the AA cross-section of a plurality of gate structures formed on sections of the monolithic vertical fin in FIG. 3, in accordance with an embodiment of the present invention.

In one or more embodiments, the gate structures 130 can extend above the top surface of the vertical fin 120 and extend down the sidewalls of the vertical fin to form a gate on three sides of the vertical fin 120.

In one or more embodiments, the gate structure 130 can include a gate dielectric layer 131 formed on at least a portion of the exposed surfaces of the vertical fin 120 and a conductive gate electrode including a conductive gate fill layer 134 and optionally a work function layer 132 between the gate dielectric layer 131 and the conductive gate fill layer 134. In some embodiments, the gate structure can further include a dielectric cap (not shown) on top of the conductive gate fill layer 134. In various embodiments, the gate structure 130 can be formed by self-aligned double patterning (SADP) or self-aligned quadruple patterning (SAQP) techniques.

In various embodiments, the gate structure may be formed by a 'gate first' process, in which layers for the gate dielectric layer 131, work function layer 132, and conductive gate fill layer 134 can be formed on one or more vertical fin(s) 120. A lithography mask (e.g., a photoresist layer and/or hardmask) can be formed on the conductive gate fill layer over the one or more vertical fin(s) 120, and patterned to expose portions of the conductive gate fill layer 134, work function layer 132, and gate dielectric layer 131 for subsequent removal. An etching process (e.g., RIE) can be utilized to remove the conductive gate fill layer 134, work function layer 132, and gate dielectric layer 131 to expose portions of the substrate 110 and vertical fin 120.

In one or more embodiments, a gate structure 130 can be formed by a 'gate-last' process. In a gate-last process, a dummy gate structure (not shown) is formed first, followed by the gate spacer, source/drain, and interlevel dielectric. The dummy gate is then removed and replaced by the actual gate structure 130. In various embodiments, the gate dielectric layer 131 can be formed on the exposed surfaces within the void space formed by the gate spacer 140 after removal of the dummy gate, and on the exposed surfaces of the vertical fin 120 within the void space 132. A work function layer 132 can be formed on the gate dielectric layer 131. A conductive gate fill layer 134 can be formed in the remain void space after formation of the gate dielectric layer and work function layer.

In various embodiments, the gate dielectric layer 131 can include silicon oxide (SiO), silicon nitride (SiN), silicon oxynitride (SiON), boron nitride (BN), high-k dielectric materials, or a combination of these materials. Examples of high-k dielectric materials include, but are not limited to, metal oxides such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material can further include dopants such as lanthanum (La) and aluminum (Al).

In various embodiments, the conductive gate fill layer 134 material can include doped polycrystalline silicon (p-Si) or amorphous silicon (a-Si), germanium (Ge), silicon-germanium (SiGe), a metal (e.g., tungsten, titanium, tantalum, ruthenium, zirconium, cobalt, copper, aluminum, lead, platinum, tin, silver, or gold), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO), cobalt silicide (CoSi), or nickel silicide (NiSi)), carbon nanotube(s) (CNTs), conductive carbon, graphene, or any suitable combination of these materials. The conductive gate fill layer material can further include dopants that are incorporated during or after formation (e.g., deposition).

In various embodiments, the gate structure 130 (e.g., gate stack) can further include a work function setting layer. The work function layer 132 can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

In various embodiments, the lithography mask can be removed after formation (e.g., etching) of the gate structures 130. In various embodiments, a gate insulator cap layer can optionally be formed on the conductive gate fill layer 134, or the hardmask of the lithography mask can remain on the conductive gate fill layer 134 as a gate insulator cap layer after removal of a photoresist layer, where the photoresist layer can be removed by known methods (e.g., stripping, ashing, etc.).

Figure 5:
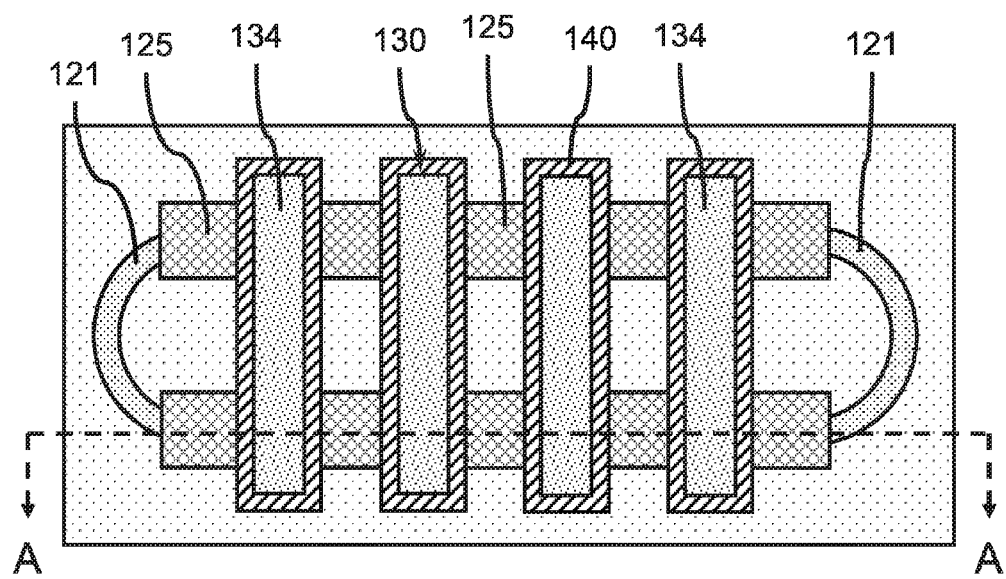
FIG. 5 is a top view showing a gate spacer formed on each of the plurality of gate structures and source/drains formed on the monolithic vertical fin, in accordance with an embodiment of the present invention.

FIG. 5 is a top view showing a gate spacer formed on each of the plurality of gate structures and source/drains formed on the monolithic vertical fin, in accordance with an embodiment of the present invention.

In one or more embodiments, a gate spacer 140 can be formed on each of the plurality of gate structures 130 formed across the long straight wall sections 122 of the vertical fin 120. Each gate spacer 140 may surround the gate structure 130 on four sides, such that the gate structure 130 is within the gate spacer 140. The gate spacers 140 can be formed on the gate structures, for example, by a conformal deposition (e.g., ALD, PEALD) to form gate spacers of a predetermined thickness at least on the sidewalls of the gate structure(s) 130. In various embodiments, the material of the gate spacer 140 can be removed from horizontal surfaces, for example, by an etch-back process (e.g., reactive ion etch (RIE)). In various embodiments, the gate spacer 140 can also be formed on a gate insulator cap if present.

In various embodiments, the walls of the gate spacer 140 can have a thickness in the range of about 3 nm to about 15 nm, or in the range of about 4 nm to about 8 nm, although greater or less thickness can also be used.

In one or more embodiments, the gate spacer 140 can be can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

Figure 6:
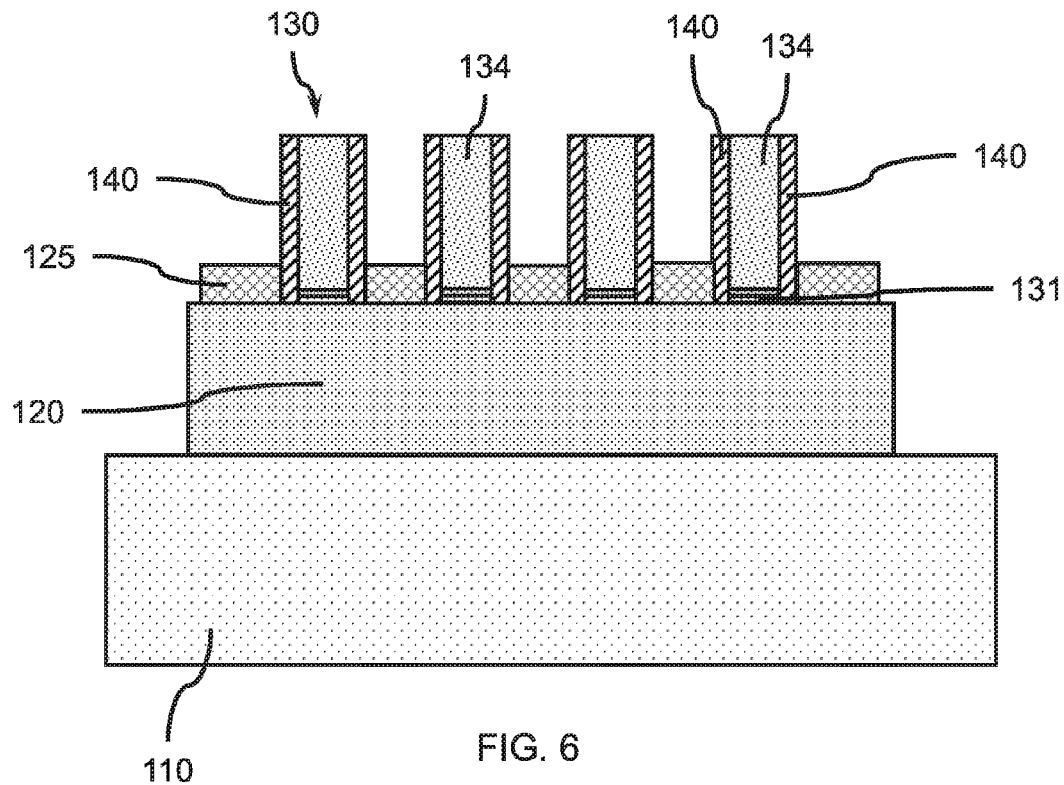
FIG. 6 is a cross-sectional view showing the AA cross-section of the gate structure and source/drains on the vertical fin in FIG. 5, in accordance with an embodiment of the present invention.

FIG. 6 is a cross-sectional view showing the AA cross-section of the gate structure and source/drains on the vertical fin in FIG. 5, in accordance with an embodiment of the present invention.

In one or more embodiments, the gate spacers 140 can cover the sidewalls of the gate structures 130, including the conductive gate fill layer 134, gate dielectric layer 131, and work function layer 132 and/or gate insulator cap if present.

In one or more embodiments, source/drains 125 can be formed on the vertical fin 120, where the source/drains 125 can be formed on opposite sides of each gate structure 130 adjacent to a sidewall of a gate spacer 140. In various embodiments, the source/drains 125 can be formed by epitaxial growth on exposed portions of the vertical fin 120, and/or dopants can be implanted into portions of the vertical fin 120. The source/drain(s) 125 can be in-situ doped (where doping and epitaxy growth are performed at the same time), and/or ex-situ doped (where doping occurs before and/or after epitaxy). Dopants can be incorporated during epitaxy (e.g., by in-situ epitaxy) or by any other suitable doping techniques, including but not limited to, ion implantation, gas phase doping, plasma doping, plasma immersion ion implantation, cluster doping, infusion doping, liquid phase doping, solid phase doping, etc. In various embodiments, the source/drains 125 can be doped to form n-type or p-type source/drains to fabricate NFETs or PFETs. Although the top surface of the source/drain(s) 125 are depicted as above the top surface of the fin 120 shown in FIG. 6, the top surface of the source/drain 125 can also be coplanar with or below the top surface of the vertical fin 120.

In one or more embodiments, the epitaxial source/drains 125 can be silicon, silicon germanium, germanium, carbon doped silicon, carbon doped silicon germanium, or any other suitable semiconductor material. The source/drains 125 can be single crystal grown on single crystal vertical fins 120.

In a non-limiting exemplary embodiment, the source/drain 125 can be epitaxially grown on the exposed surfaces of a strained, crystalline Si or SiGe vertical fin 120 having a predetermined crystal orientation, where the source/drain(s) 125 can be formed on the three exposed surfaces of the vertical fin 120.

The portion of the vertical fin 120 between the source/drains 125 and below a gate structure 130 can form a channel of a FinFET, where the current would flow parallel to the plane of the substrate 110 from one source/drain to another (e.g., a horizontal FinFET). The gate structure 130 can control the amount of current flowing through the channel of the FinFET device.

Figure 7:
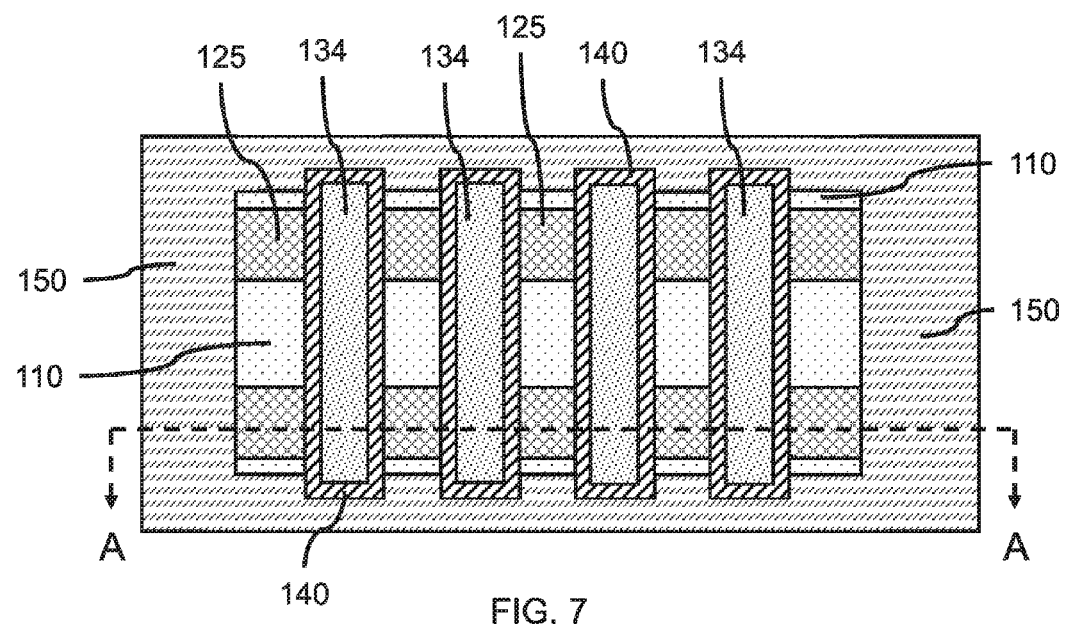
FIG. 7 is a top view showing an interlevel dielectric (ILD) formed on and around the gate spacers, and openings formed in the ILD for source/drain contacts, in accordance with an embodiment of the present invention.

FIG. 7 is a top view showing an interlevel dielectric (ILD) layer formed on and around the gate spacers, and openings formed in the ILD for source/drain contacts, in accordance with an embodiment of the present invention.

In one or more embodiments, an interlevel dielectric (ILD) layer 150 can be formed on and around the strained vertical fin 120 and gate spacers 140, where the ILD layer 150 can be blanket deposited on the exposed surfaces.

In various embodiments, the ILD layer 150 can be silicon oxide (SiO), a low-K insulating dielectric, silicon oxynitride (SiON), carbon doped silicon oxide, fluorine doped silicon oxide, boron carbon nitride (BCN), hydrogen silsesquioxane polymer (HSQ), methyl silsesquioxane polymer (MSQ), methyl doped silica or $SiO_x(CH_3)_y$ or $SiC_xO_yH_z$, organosilicate glass (SiCOH), porous SiCOH, and/or combinations thereof. Excess ILD material may be etched back or removed by chemical-mechanical polishing (CMP). A chemical-mechanical polishing can be used to removed excess ILD material and provide a smooth flat surface.

In one or more embodiments, a masking layer can be formed on the ILD layer 150 and the top surface of the gate structure 130, and patterned to expose portions of the ILD layer, as would be known in the art. The exposed portions of the ILD layer 150 can be removed, for example, by a directional etch (e.g., RIE) to form openings down to the vertical fin 120, source/drain 125, and substrate surface. Removal of the portions of the ILD layer 150 can expose the underlying sections of the vertical fin 120 and portions of the substrate 110.

Figure 8:
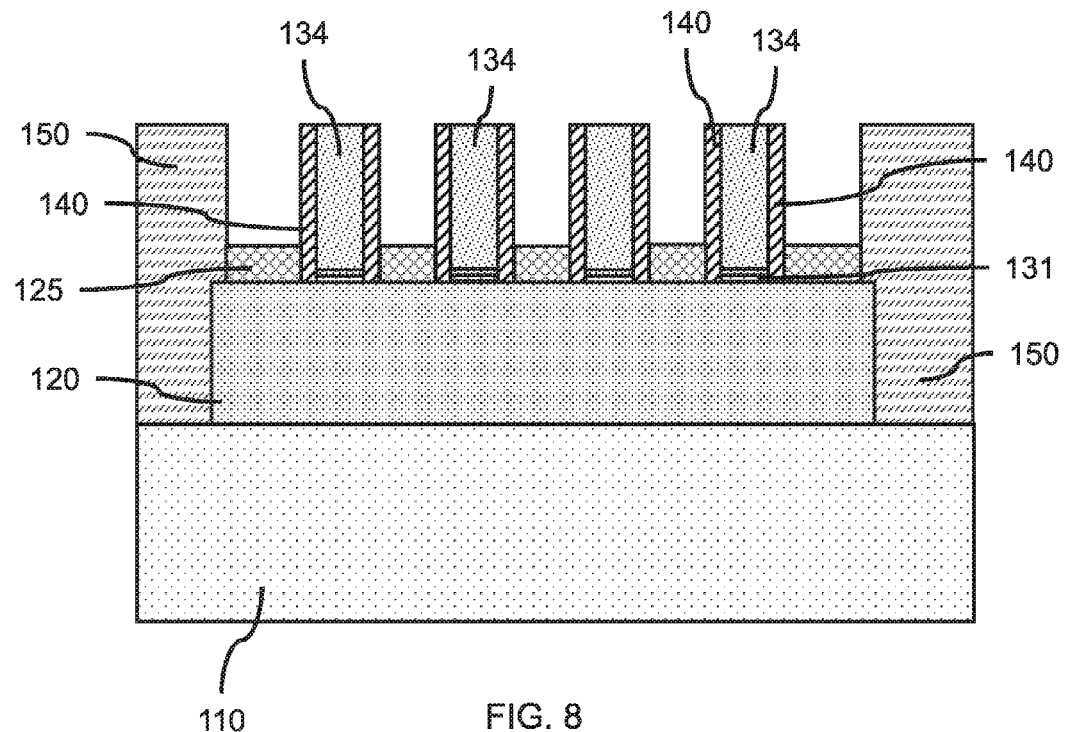
FIG. 8 is a cross-sectional view showing the AA cross-section of the ILD layer, openings, and gate structures in FIG. 7, in accordance with an embodiment of the present invention.

FIG. 8 is a cross-sectional view showing the AA cross-section of the ILD layer, openings, and gate structures in FIG. 7, in accordance with an embodiment of the present invention.

In various embodiments, the openings in the ILD layer 150 can be aligned with the source/drains 125, and can be formed by patterning and removing the ILD layer in the source/drain region followed by depositing conducting material on the exposed substrate 110 and source/drains 125. In various embodiments, the ILD layer 150 can be a different material than the gate spacer 140 material, such that the ILD layer can be selectively removed to form openings adjacent to the gate spacer 140, for example, by a selective RIE.

It should be noted that the vertical fin 120 has not been cut or sectioned up to the time that the source/drains 125 and gate structure(s) 130 have been formed. The monolithic vertical fin 120 is still a single-wall annulus across which the source/drain contacts 160 and gate structures 130 are formed, and the vertical fin 120 would still be in a strained state (e.g., compressive or tensile).

Figure 9:
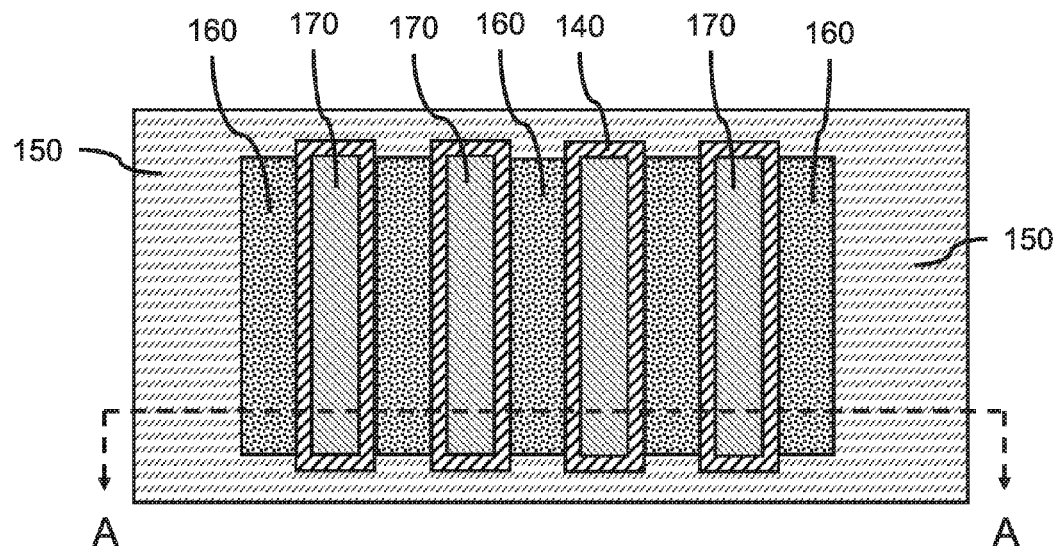
FIG. 9 is a top view showing a plurality of source/drain contacts formed in the openings in the ILD layer between and/or adjacent to each gate spacer and on a vertical fin and/or source/drain, in accordance with an embodiment of the present invention.

FIG. 9 is a top view showing a plurality of source/drain contacts formed in the openings in the ILD layer between and/or adjacent to each gate spacer and on a vertical fin and/or source/drain, in accordance with an embodiment of the present invention.

In one or more embodiments, a source/drain contact 160 may be formed on exposed sections of a source/drain 125 on the vertical fin 120, where the source/drains 125 can be epitaxially grown on the crystalline surfaces of the vertical fin 120, or formed in the vertical fin 120, where the dopants have been implanted into portions of the vertical fin 120. The source/drains 125 and source/drain contacts 160 can be formed on opposite sides of each gate structure 130. For a gate-last process, the conductive gate fill layer 134 can be recessed and a gate insulator cap 170 can be formed on top of the conductive gate fill layer 134.

Figure 10:
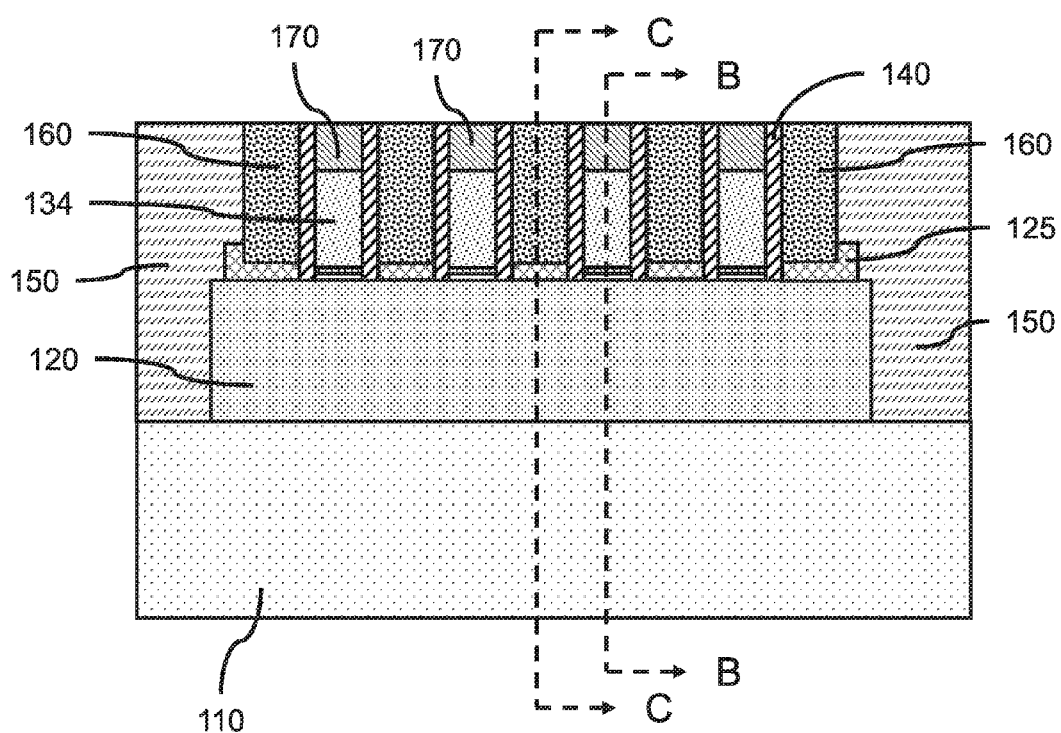
FIG. 10 is a cross-sectional view showing the AA cross-section of the source/drains, source/drain contacts, and gate structures on the vertical fin in FIG. 9, in accordance with an embodiment of the present invention.

FIG. 10 is a cross-sectional view showing the AA cross-section of the source/drains, source/drain contacts, and gate structures on the vertical fin in FIG. 9, in accordance with an embodiment of the present invention.

A chemical-mechanical polishing can be conducted to remove excess source/drain contact material and provide a smooth, flat surface.

The source/drain contacts 160 can be a conductive material, including but not limited to tungsten, titanium, tantalum, ruthenium, zirconium, cobalt, tantalum nitride, titanium nitride, cobalt silicide, nickel silicide, carbon nanotube, conductive carbon, graphene, or any suitable combination of these materials. The conductive material can further include dopants that are incorporated during or after deposition.

In various embodiments, the top surfaces of the source/drain contacts 160, gate insulator caps 170, gate spacers 140, can be exposed for subsequent processing.

Figure 11:
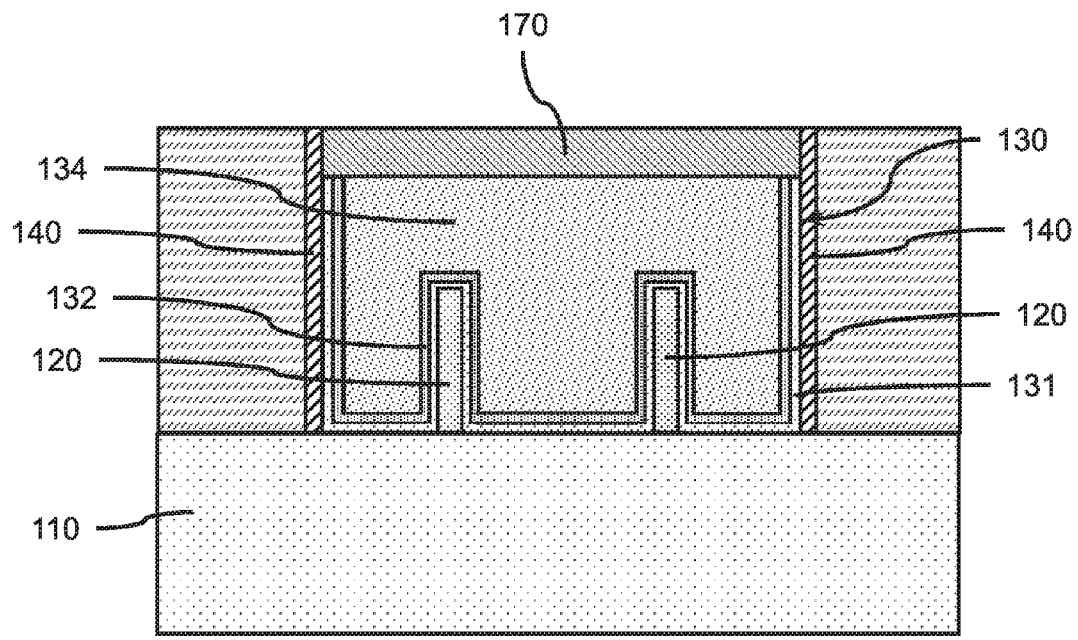
FIG. 11 is a cross-sectional view showing the BB cross-section of the gate structure on the vertical fin in FIG. 10, in accordance with an embodiment of the present invention.

FIG. 11 is a cross-sectional view showing the BB cross-section of the gate structure on the vertical fin in FIG. 10, in accordance with an embodiment of the present invention.

In one or more embodiments, the gate structure 130 can include a gate dielectric layer 131 formed on the exposed top and sidewall surfaces of the vertical fin 120 and a conductive gate electrode including the conductive gate fill layer 134 and optionally the work function layer 132. In various embodiments, each gate spacer 140 and gate structure 130 can span two vertical fin segments, where each straight section 122 of the vertical fin can act as a channel for a single FinFET device. The gate structure can fill the space between the two straight sections 122. The gate insulator cap 170 can cover the gate structure 130 within the gate spacer 140. The ILD layer 150 can surround the gate spacer 140 and gate structure 130.

In one or more embodiments, the height of the conductive gate fill layer 134 in the gate structure 130 may be reduced, for example, by a selective dry plasma etch (e.g., reactive ion etch (RIE)). A gate insulator cap 170 can be formed on the reduced height gate structure within each gate spacer 140, where the gate insulator cap 170 can be formed in the space opened up in the gate spacer 140 by removal of the portion of the conductive gate fill layer 134. The source/drain contacts and other features can be masked and patterned using a resist to expose the top surfaces of the gate structures 130 for removal of the portion of the conductive gate fill layer 134, as would be known in the art.

Alternatively, the gate insulator cap 170 can be formed at the beginning of gate formation. Specifically, a gate insulator cap layer can be deposited on top of the conductive gate fill layer 134 and the gate dielectric layer 131. Then the gate insulator cap layer and the conductive gate fill layer 134 with the gate dielectric layer 131 can be patterned together to form the gate structure 130 (i.e., gate stack).

Figure 12:
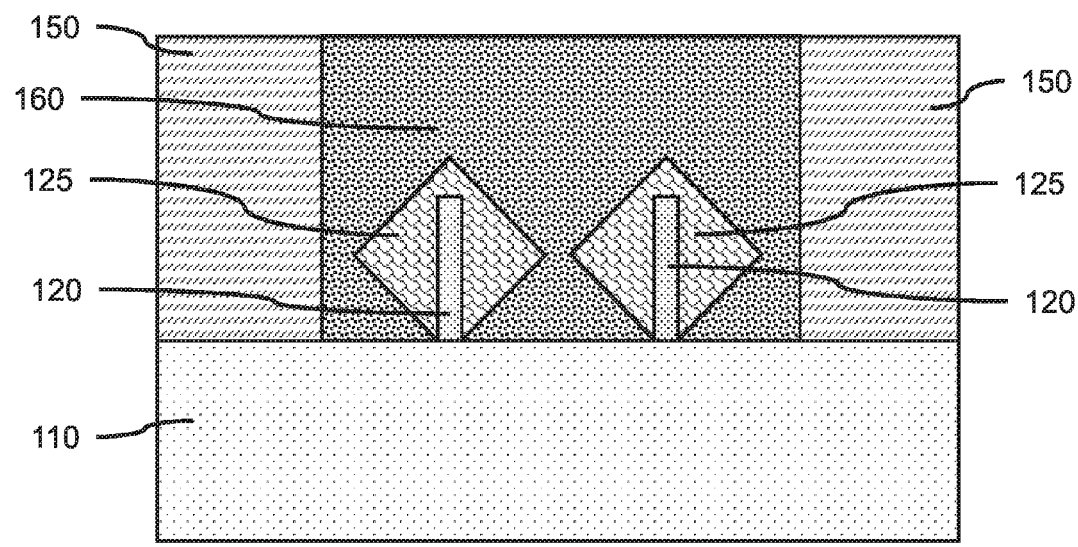
FIG. 12 is a cross-sectional view showing the CC cross-section of the source/drain contacts on the source/drains and vertical fin in FIG. 10, in accordance with an embodiment of the present invention.

FIG. 12 is a cross-sectional view showing the CC cross-section of the source/drain contacts on the source/drains and vertical fin in FIG. 10, in accordance with an embodiment of the present invention.

In one or more embodiments, the epitaxially grown source/drains 125 can have a diamond shape, a rectangular shape, as well as other shapes depending upon the crystal faces of the vertical fin 120 that the source/drain is grown on.

In various embodiments, the source/drains 125 can be grown until the source/drains reach a predetermined size, where the source/drains remain separate unmerged source/drains. A conductive material of a source/drain contact 160 can fill in the space between the unmerged source/drains and vertical fin segments 122, where the source/drain contact can surround all of the exposed surfaces.

In various embodiments, the source/drains 125 can be grown until the source/drain on each straight vertical fin segment 122 becomes large enough to merge with the neighboring source/drain 125. A merged source/drain can form a void space between the adjacent vertical fin segments and below the merged source/drain. In various embodiments, the ILD material can be sufficiently flowable to fill such a void space. A conductive material of a source/drain contact 160 can form on the upper exposed surfaces of the merged source/drains.

Figure 13:
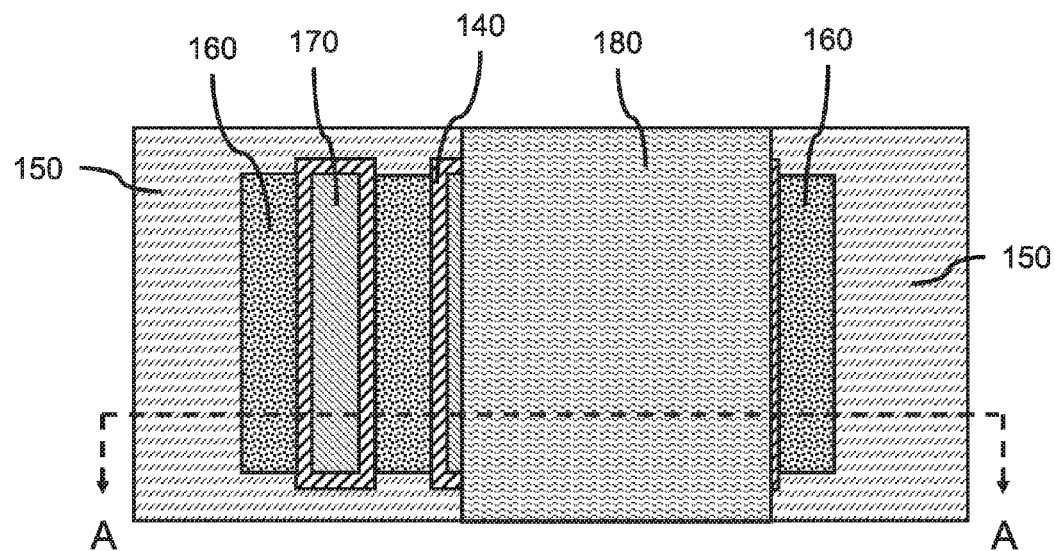
FIG. 13 is a top view showing a masking layer formed on a portion of the source/drain contacts, gate spacers, and gate insulator caps, in accordance with an embodiment of the present invention.

FIG. 13 is a top view showing a masking layer formed on a portion of the source/drain contacts, gate spacers, and gate insulator caps, in accordance with an embodiment of the present invention.

In one or more embodiments, a masking layer 180 (e.g., photoresist and/or a hardmask) can be formed, patterned, and developed on at least a portion of the exposed top surfaces to form openings, as would be known in the art. The masking layer 180 can cover predetermined gate insulator caps 170 and source/drain contacts 160, while exposing other predetermined source/drain contacts 160.

In various embodiments, the mask 180 can be removed after removing the source/drain contact, or after the complete formation of the trenches in the source/drain region. Typically the mask 180 (particularly when it is photoresist) would be removed before filling the trench with material (e.g., insulator).

Figure 14:
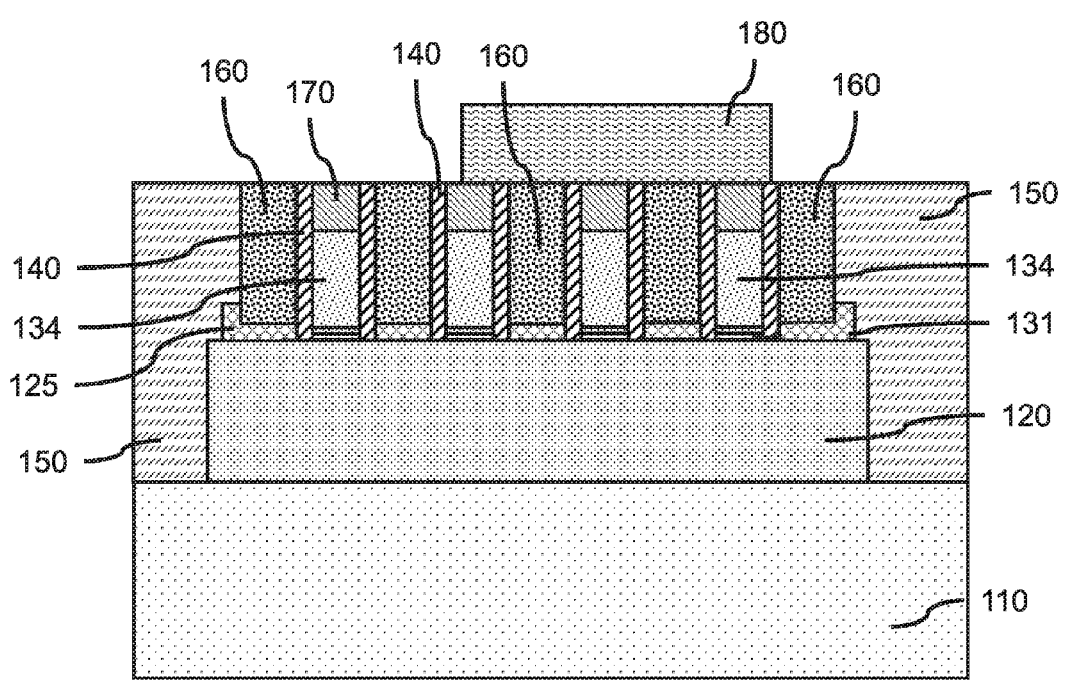
FIG. 14 is a cross-sectional view showing the AA cross-section of the masking layer, ILD, source/drain contacts, and gate structures on the vertical fin in FIG. 13, in accordance with an embodiment of the present invention.

FIG. 14 is a cross-sectional view showing the AA cross-section of the masking layer, ILD, source/drain contacts, and gate structures on the vertical fin in FIG. 13, in accordance with an embodiment of the present invention.

In one or more embodiments, the openings in the masking layer 180 do not need to be perfectly aligned with the edges of the gate spacer 140 or gate insulator caps 170, as long as the source/drain contacts intended to be removed are exposed for subsequent etching processes. The material of the gate spacer 140 or gate insulator caps 170 can be selected to withstand the selective etching of the source/drain contact material.

In various embodiments, the material of the source/drain contact 160 can be tungsten (W), titanium (Ti), cobalt (Co), or combinations thereof.

In various embodiments, the gate spacers 140 and gate insulator caps 170 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the gate spacer 140 and gate insulator cap 170 can be the same material or different materials to allow selective removal.

Figure 15:
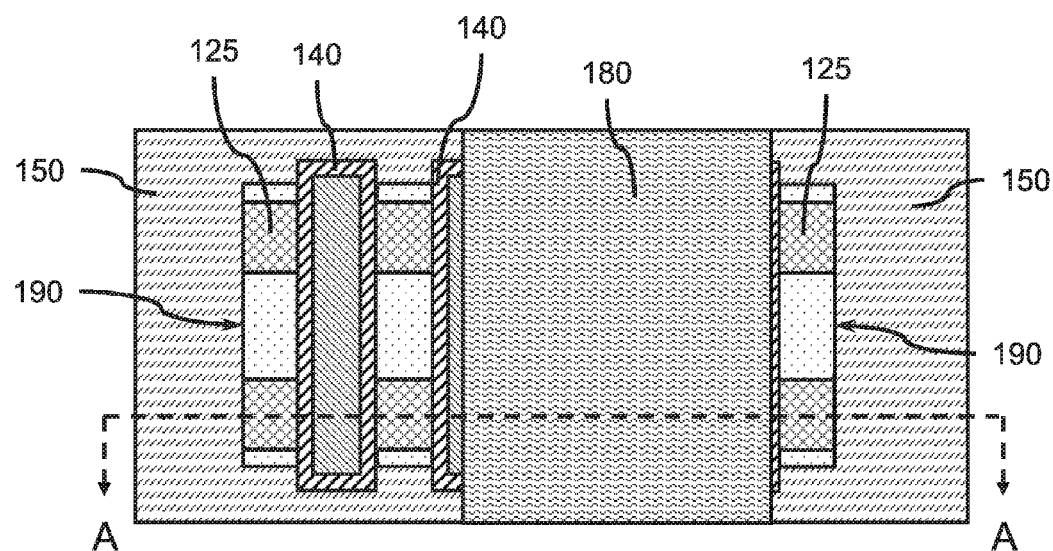
FIG. 15 is a top view showing exposed portions of the source/drains after removal of predetermined source/drain contacts, in accordance with an embodiment of the present invention.

FIG. 15 is a top view showing exposed portions of the source/drains after removal of predetermined source/drain contacts, in accordance with an embodiment of the present invention.

In one or more embodiments, the source/drain contacts 160 exposed by the openings in the masking layer 180 can be selectively removed to expose the underlying source/drains 125 on and/or in the vertical fin 120. Predetermined source/drain contacts 160 may be removed to provide an intended arrangement of gate structures 130 and source/drains 125 with source/drain contacts 160 on the vertical fin to form one or more semiconductor devices. The arrangement may provide a combination of active and dummy gates on the vertical fin 120.

Figure 16:
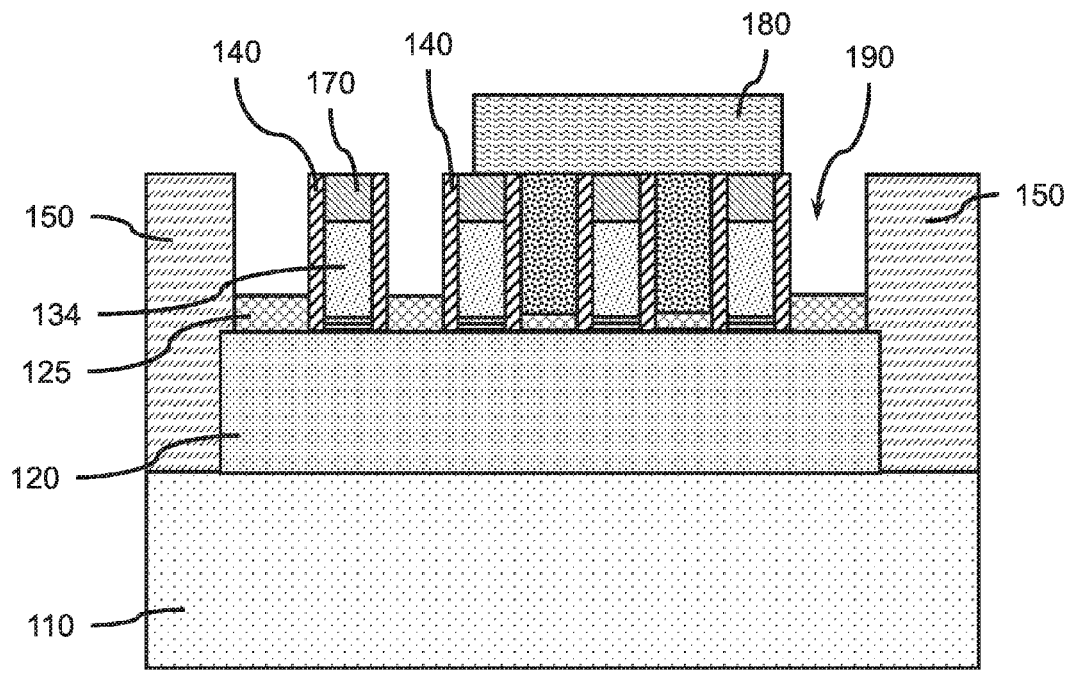
FIG. 16 is a cross-sectional view showing the AA cross-section of the removed source/drain contacts and exposed source/drains in FIG. 15, in accordance with an embodiment of the present invention.

FIG. 16 is a cross-sectional view showing the AA cross-section of the removed source/drain contacts and exposed source/drains in FIG. 15, in accordance with an embodiment of the present invention.

In various embodiments, the source/drain contacts 160 can be removed by a selective wet etch or dry plasma etch, while the gate spacers 140 remain on the gate structures 130, and the ILD remains to form trenches 190. Portions of the vertical fin 120 can be exposed by removal of the source/drain contacts 160.

Figure 17:
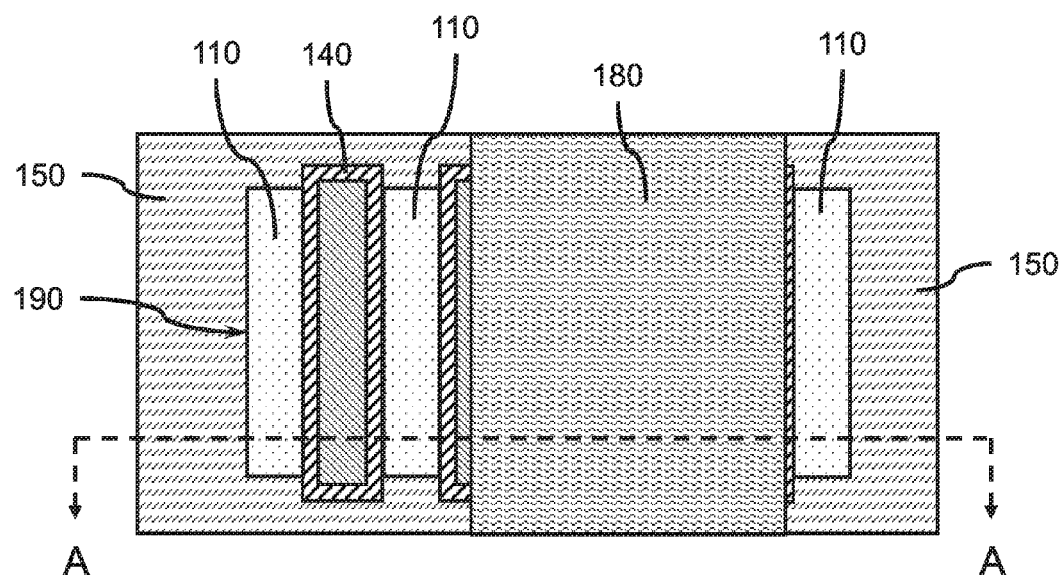
FIG. 17 is a top view showing exposed portions of the substrate after removal of the exposed source/drains and vertical fin sections from the previously formed trenches, in accordance with an embodiment of the present invention.

FIG. 17 is a top view showing exposed portions of the substrate after removal of the exposed source/drains and vertical fin sections from the previously formed trenches, in accordance with an embodiment of the present invention.

In one or more embodiments, the portions of the vertical fin 120 exposed by formation of the trenches 190 can be removed, for example, by a selective etch. The vertical fin 120 may be removed from with each of the trenches 190 to expose the underlying substrate for the subsequent formation of an isolation region between subsequently completed FinFET devices. The removal of the exposed portions of the vertical fin 120 can occur after removal of the source/drain contacts 160 and exposed source/drains 125. Separate etching processes may be used to remove the different materials of the source/drain contacts 160 (e.g., metal), source/drains 125 (e.g., semiconductor), and vertical fin 120 (e.g., Si, SiGe), where the source/drain 125 are removed to expose the vertical fin 120. The fin removal effectively cuts the fin to form separate vertical fin segments for formation of individual semiconductor devices. This fin cut occurs with the gate structures 130 and ILD layer 150 already formed on the remaining segments of the vertical fin 120, where the presence of these features anchors the cut fin segments and maintains the induced strain. This avoids elastic relaxation of a free-standing strained vertical fin 120 because the vertical fin segments are wrapped around by gates, spacers, and contact metals, so edge relaxation is minimized.

Figure 18:
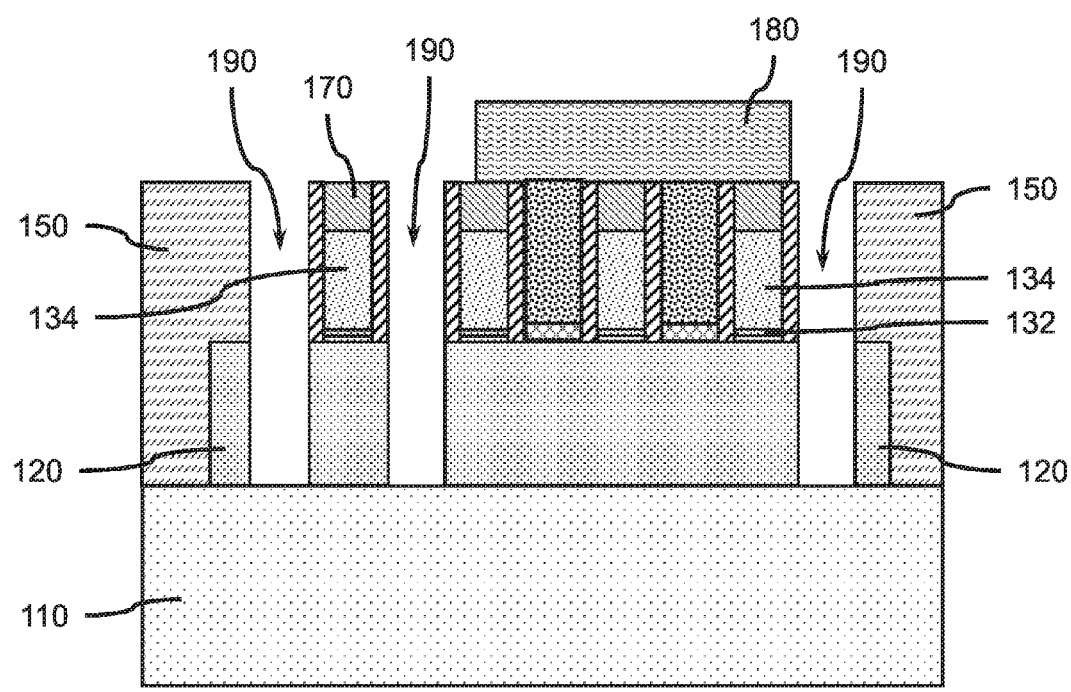
FIG. 18 is a cross-sectional view showing the AA cross-section after removal of the exposed source/drains and vertical fin sections from the previously formed trenches in FIG. 17, in accordance with an embodiment of the present invention.

FIG. 18 is a cross-sectional view showing the AA cross-section after removal of the exposed source/drains and vertical fin section from the previously formed trenches in FIG. 17, in accordance with an embodiment of the present invention.

In various embodiments, the surface of the substrate 110 is exposed at the bottom of trenches 190, where the trench is formed in and surrounded by the ILD layer 150. The formation of the trenches 190 and removal of the exposed portion of the vertical fin 120 can also remove at least a portion of the doped portion of the fin.

In various embodiments, a device structure including a plurality of gate structures 130 and source/drains 125 can remain on a portion of the vertical fin 120 and substrate 110.

Figure 19:
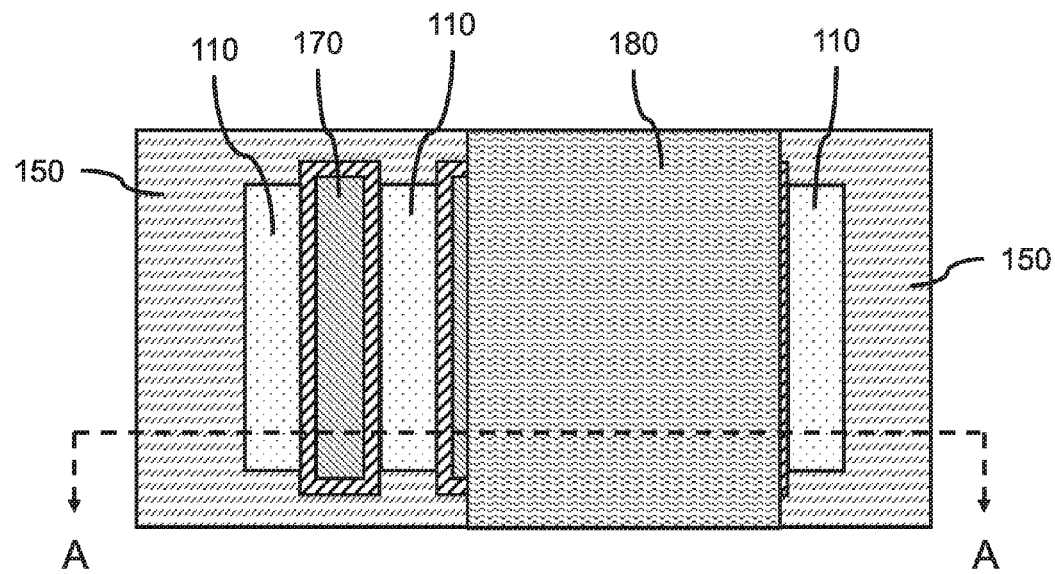
FIG. 19 is a top view showing exposed portions of the substrate after extending the trenches into the substrate for formation of an isolation region, in accordance with an embodiment of the present invention.

FIG. 19 is a top view showing exposed portions of the substrate after extending the trenches into the substrate for formation of an isolation region, in accordance with an embodiment of the present invention.

In one or more embodiments, a portion of the substrate 110 exposed at the bottom of each trench 190 can be removed to extend the trench into the substrate 110. A selective etch can be used to remove the substrate material, where the etch can be a directional etch (e.g., RIE).

Figure 20:
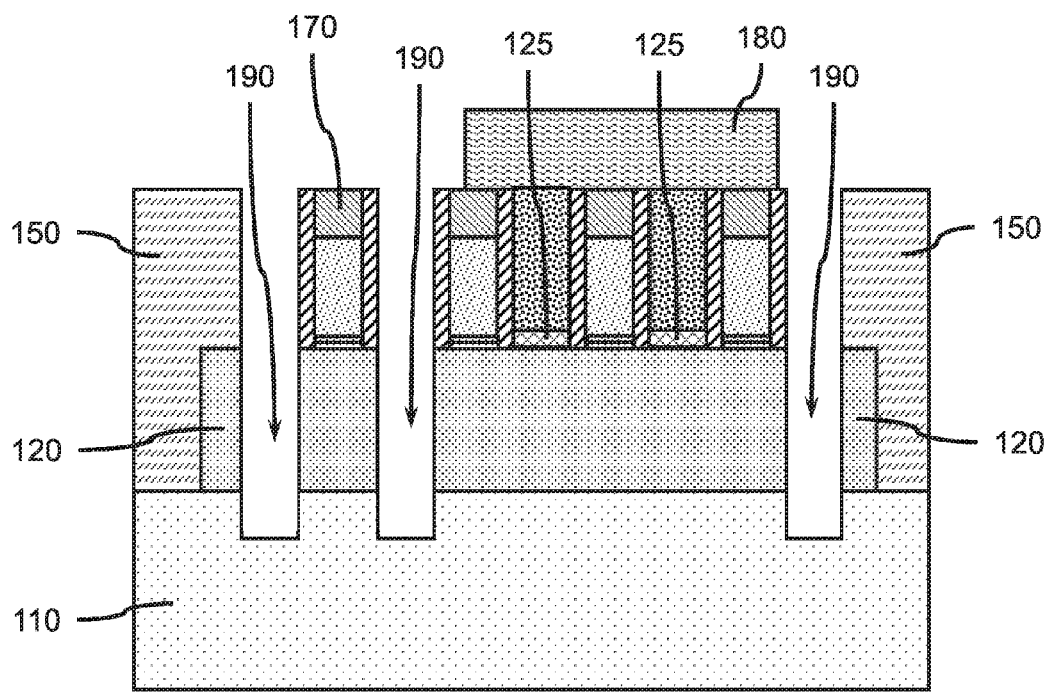
FIG. 20 is a cross-sectional view showing the AA cross-section after extending the trenches into the substrate in FIG. 19, in accordance with an embodiment of the present invention.

FIG. 20 is a cross-sectional view showing the AA cross-section after extending the trenches into the substrate in FIG. 19, in accordance with an embodiment of the present invention.

In various embodiments, the trench can be extended into the substrate by a predetermined depth, where the trench can extend below the level of the vertical fin 120 to reduce leakage current. The trenches are self-aligned with the gate structure(s) 130 through the replacement of the source/drain contacts 160, which is referenced to the location of the gate spacer 140 and gate structure(s) 130.

In one or more embodiments, the trench can be formed by a sequence of three or four separate etching steps, where the source/drain contacts 160 are selectively removed in the first step, the source/drains 125 removed in a second step, and the exposed portion(s) of the vertical fin 120 removed in a third step, with the trench 190 extended into the substrate in the third or fourth step, where each step is selective for the particular material removed.

Figure 21:
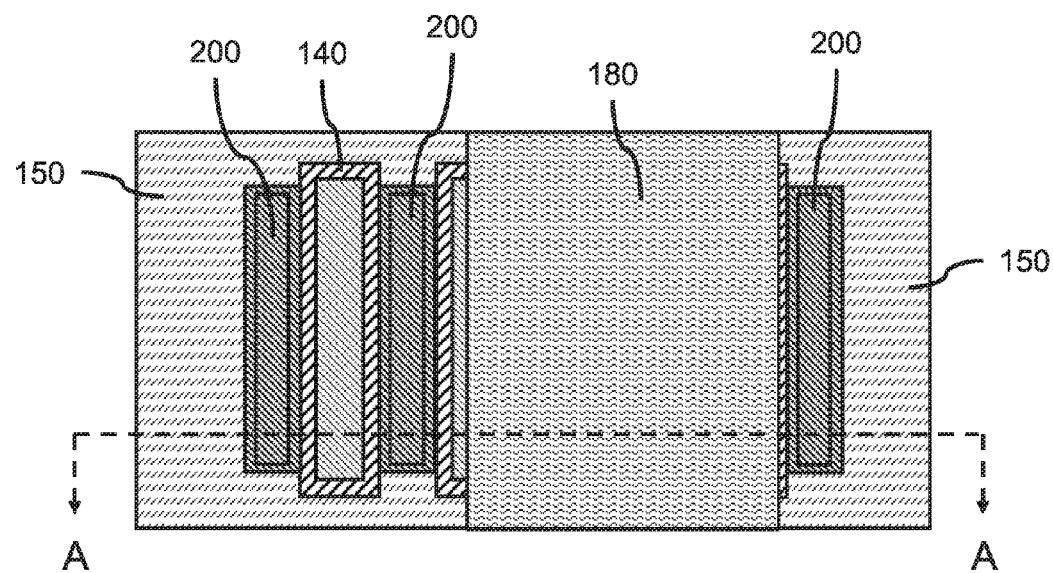
FIG. 21 is a top view showing an insulating liner formed in the trenches, in accordance with an embodiment of the present invention.

FIG. 21 is a top view showing an insulating liner formed in the trenches, in accordance with an embodiment of the present invention.

In one or more embodiments, an insulating liner 200 can be formed in each of the one or more trenches 190, where the insulating liner can be conformally deposited (e.g., ALD, PEALD) on the exposed sidewalls of each trench, including the sidewall of the gate spacer 140 and ILD layer 150. In various embodiments, the insulating liner 200 can be optional.

In one or more embodiments, the insulating liner 200 can be silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof, where the insulating liner 200 and gate insulator cap are different materials to allow selective removal.

Figure 22:
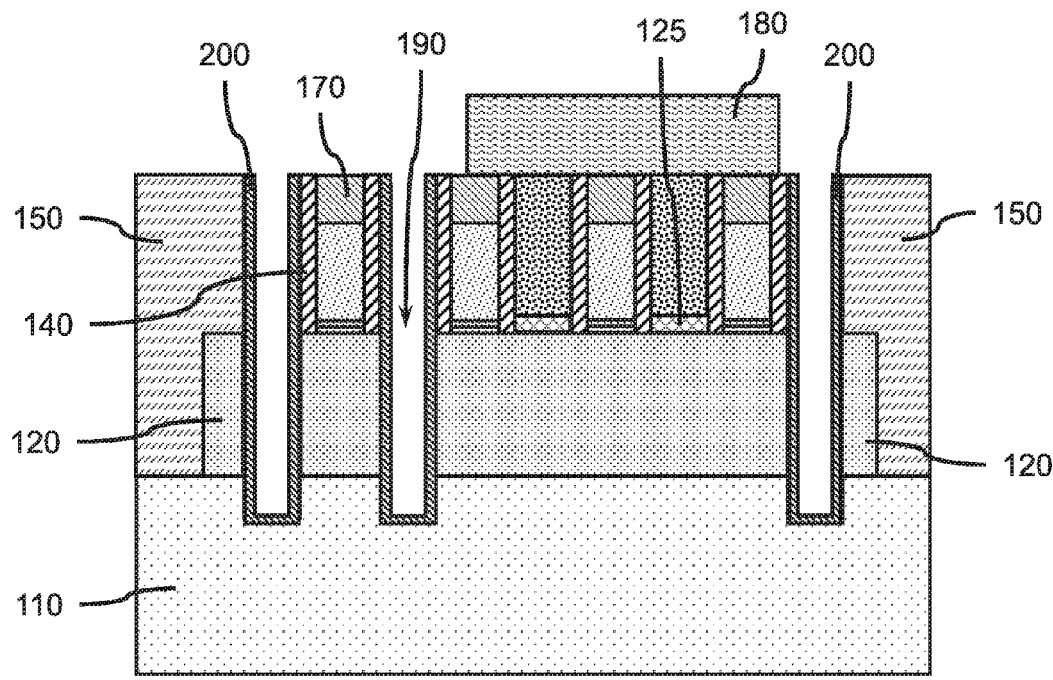
FIG. 22 is a cross-sectional view showing the AA cross-section of the insulating liner formed in the trenches in FIG. 21, in accordance with an embodiment of the present invention.

FIG. 22 is a cross-sectional view showing the AA cross-section of the insulating liner formed in the trenches in FIG. 21, in accordance with an embodiment of the present invention.

In various embodiments, the insulating liner 200 can have a thickness in the range of about 2 nm to about 15 nm, or in the range of about 4 nm to about 8 nm, where the insulating liner 200 provides a higher quality insulator at low formation temperatures to avoid damaging the gate structures 130 and source/drains 125, and reducing dopant and metal migration by the source/drains 125 and source/drain contacts 160.

Figure 23:
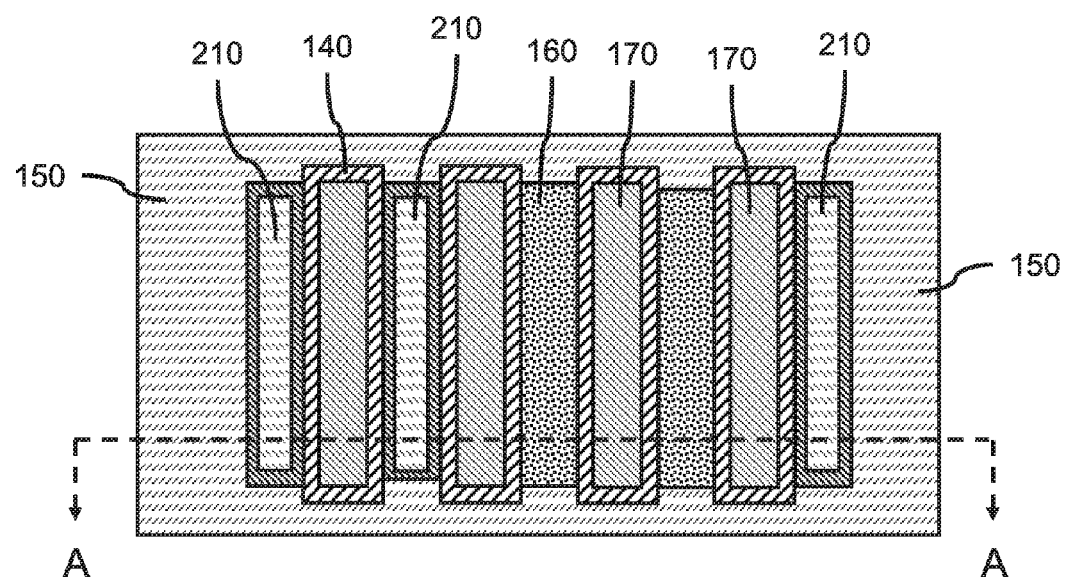
FIG. 23 is a top view showing a trench fill formed on the insulating liner in the trenches, in accordance with an embodiment of the present invention.

FIG. 23 is a top view showing a trench fill formed on the insulating liner in the trenches, in accordance with an embodiment of the present invention.

In one or more embodiments, a trench fill 210 can be formed in the trenches 190, where the trench fill 210 can be formed on the insulating liner 200. The trench fill 210 can be formed by a conformal deposition (e.g., ALD), a directional deposition (e.g., gas cluster ion beam (GCIB)) or a combination thereof to avoid pinch-off and void formation. In various embodiments, the trench fill can be formed by atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), in-situ radical assisted deposition, low temperature oxide deposition (LTO), ozone/TEOS deposition, limited reaction processing CVD (LRP-CVD), spin-on-coating, ion beam deposition, electron beam deposition, laser assisted deposition, chemical solution deposition, or any combination of the methods.

In one or more embodiments, the trench fill 210 can be silicon oxide, a low-K insulating dielectric, silicon oxynitride, carbon doped silicon oxide (SiO), fluorine doped silicon oxide, boron carbon nitride (BCN), hydrogen silsesquioxane polymer (HSQ), methyl silsesquioxane polymer (MSQ), methyl doped silica or $SiO_x(CH3)_y$ or $SiC_xO_yH_z$ organosilicate glass (SiCOH), and porous SiCOH, and combinations thereof.

Figure 24:
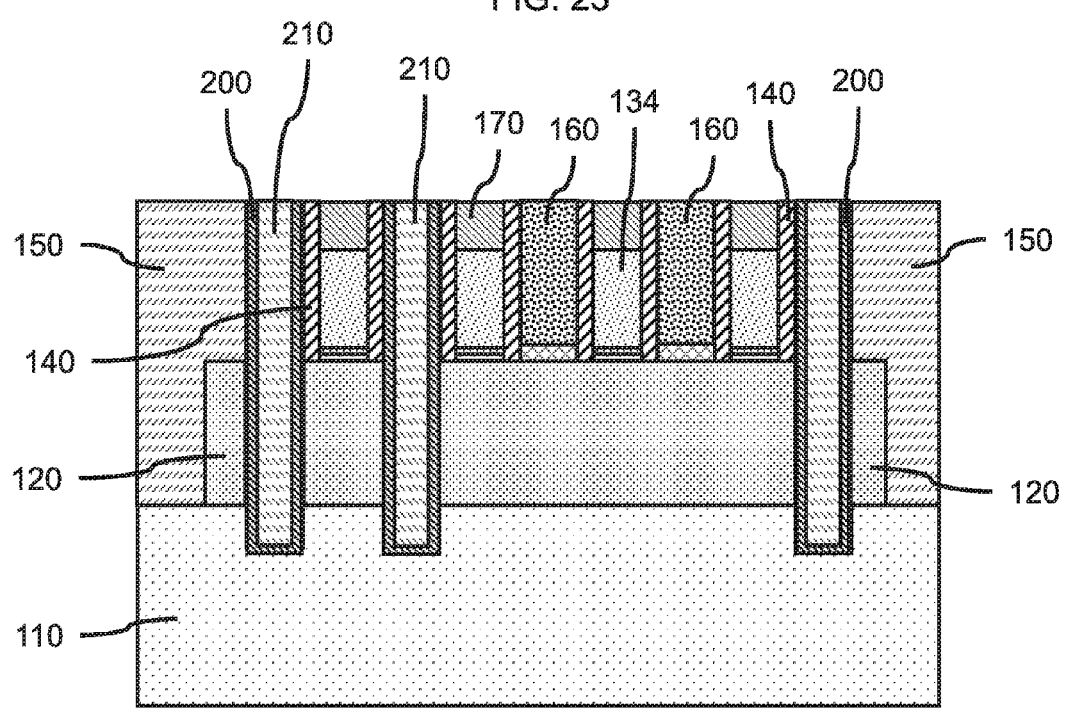
FIG. 24 is a cross-sectional view showing the AA cross-section of the trench fill formed on the insulating liner in the trenches in FIG. 23, in accordance with an embodiment of the present invention.

FIG. 24 is a cross-sectional view showing the AA cross-section of the trench fill formed on the insulating liner in the trenches in FIG. 23, in accordance with an embodiment of the present invention.

In one or more embodiments, the trench fill 210 is separated from the gate structure by the thickness of the insulating liner 200 and gate spacer 140, where the trench fill 210 is self-aligned with the gate structure to provide reduced spacing between adjacent semiconductor devices, and well controlled dimensions for isolation regions. Without self-alignment, additional spacing would be used to accommodate the inherent process variations such as misalignment, variations in overlay and critical dimensions.

In various embodiments, the FinFET device can have a strained channel formed by the strained vertical fin 120 and a self-aligned isolation region (e.g., shallow trench isolation (STI)) formed by the trench fill 210 and optional insulating liner 200 adjacent to the semiconductor device and in the substrate. An active gate structure can be over and around the FinFET channel, and dummy gate structures can be on the ends of the vertical fin to maintain the strained state of the channel. Source/drains 125 and source/drain contacts 160 can be on opposite sides of the active gate structure and between the active gate structure and a dummy gate structure.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of fabricating a vertical fin field effect transistor with a strained channel, comprising:
   forming a strained vertical fin on a substrate;
   forming a plurality of gate structures on the strained vertical fin;
   forming an interlevel dielectric on the strained vertical fin;
   forming a source/drain contact on the strained vertical fin adjacent to each of the plurality of gate structures;
   selectively removing one or more of the source/drain contacts to form a trench adjacent to a gate structure;
   removing a portion of the strained vertical fin exposed by forming the trench; and
   removing a portion of the substrate after removing the exposed portions of the strained vertical fin.

2. The method of claim 1, further comprising forming an insulating liner in each trench and a trench fill on the insulating liner.

3. The method of claim 2, wherein the insulating liner is silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof.

4. The method of claim 1, wherein the strained vertical fin is single crystal silicon-germanium (Site) and the substrate is single crystal silicon.

5. The method of claim 4, further comprising forming a plurality of gate spacers on the strained vertical fin, wherein each of the plurality of gate structures is formed within one of the gate spacers.

6. The method of claim 1, wherein the source/drain contacts are tungsten, titanium, cobalt, or a combination thereof.

7. The method of claim 6, wherein the source/drain contacts are removed using a selective dry etch.

8. The method of claim 1, wherein each trench is self-aligned with the adjacent gate structure after removal of the source/drain contacts by exposing a sidewall of the gate spacer between the trench and the adjacent gate structure.

9. A method of fabricating a vertical fin field effect transistor with a strained channel, comprising:
   forming a strained silicon-germanium (SiGe) vertical fin on a single crystal silicon substrate or a strained silicon (Si) vertical fin on a single crystal silicon-germanium substrate;
   forming three or more gate structures on the strained SiGe vertical fin or strained Si vertical fin;
   forming a gate spacer on each of the three or more gate structures;
   forming an interlevel dielectric on the gate spacers;
   forming four or more openings in the interlevel dielectric;
   forming four or more source/drain contacts in the interlevel dielectric on the strained SiGe vertical fin or strained Si vertical fin, where at least two of the source/drain contacts are between the gate spacers;
   selectively removing one or more of the source/drain contacts to form a trench in the interlevel dielectric;
   removing a portion of the strained SiGe vertical fin or strained Si vertical fin exposed by forming the trench; and
   removing a portion of the substrate after removing the exposed portions of the strained SiGe vertical fin or strained Si vertical fin.

10. The method of claim 9, wherein the strained silicon-germanium (SiGe) vertical fin is epitaxially grown on the single crystal silicon substrate, or the strained silicon (Si) vertical fin is epitaxially grown on a single crystal silicon-germanium substrate.

11. The method of claim 9, wherein the height of the strained SiGe vertical fin and the germanium (Ge) concentration of the strained SiGe vertical fin are below a threshold value at which dislocations would appear in the vertical fin.

12. The method of claim 9, wherein removing an exposed portion of the strained SiGe vertical fin or strained Si vertical fin from the one or more trenches forms a plurality of strained SiGe vertical fin sections or strained Si vertical fin sections.

13. The method of claim 12, further comprising extending the one or more trenches into the substrate by a predetermined depth below the strained SiGe vertical fin or strained Si vertical fin.

14. The method of claim 13, further comprising forming an insulating liner in each of the one or more trenches.

* * * * *